United States Patent
Matsuzaki et al.

(10) Patent No.: US 7,086,016 B2
(45) Date of Patent: Aug. 1, 2006

(54) METHOD AND APPARATUS FOR VERIFYING LOGICAL EQUIVALENCY BETWEEN LOGIC CIRCUITS

(75) Inventors: Kazuhiro Matsuzaki, Kawasaki (JP); Hiroji Takeyama, Kawasaki (JP); Miki Takagi, Kawasaki (JP); Hiroshi Noguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 250 days.

(21) Appl. No.: 10/453,662

(22) Filed: Jun. 4, 2003

(65) Prior Publication Data

US 2003/0237065 A1 Dec. 25, 2003

(30) Foreign Application Priority Data

Jun. 20, 2002 (JP) ............................. 2002-180513

(51) Int. Cl.
*G06F 17/50* (2006.01)
(52) U.S. Cl. ......................................................... 716/3
(58) Field of Classification Search ................ 716/1–5; 703/13–14
See application file for complete search history.

(56) References Cited

U.S. PATENT DOCUMENTS

| | | | | |
|---|---|---|---|---|
| 5,481,717 A | * | 1/1996 | Gaboury | 717/126 |
| 5,491,639 A | * | 2/1996 | Filkorn | 716/5 |
| 6,321,173 B1 | * | 11/2001 | Foster | 702/109 |
| 6,336,206 B1 | * | 1/2002 | Lockyear | 716/7 |
| 6,473,884 B1 | * | 10/2002 | Ganai et al. | 716/3 |
| 6,611,947 B1 | * | 8/2003 | Higgins et al. | 716/5 |
| 2002/0144215 A1 | * | 10/2002 | Hoskote et al. | 716/3 |

FOREIGN PATENT DOCUMENTS

| | | |
|---|---|---|
| JP | 1-288969 | 11/1989 |
| JP | 5-233749 | 9/1993 |
| JP | 9-297784 | 11/1997 |
| JP | 2000-020744 | 1/2000 |
| JP | 2001-052043 | 2/2001 |

* cited by examiner

*Primary Examiner*—Leigh M. Garbowski
(74) *Attorney, Agent, or Firm*—Staas & Halsey LLP

(57) ABSTRACT

A method for verifying a logical equivalency between two logic circuits having different combinational logic circuits includes the steps of converting into a logic circuit a logic cone that has been determined for each of the two logic circuits, the logic cone including all inputs and all logic circuits which affect one output of the combinational logic circuit, storing a logical expression converted by the converting step and a logic circuit element included in the logic cone while correlating the logical expression with the logic circuit element, and specifying the logic circuit element corresponding to a specified term in the logical expression that has been converted.

7 Claims, 15 Drawing Sheets

A1*(~B1)*(~(A0*B0))

(~A1)*B1*(~(A0*B0))

(~A1)*(~B1)*A0*B0

A1*B1*A0*B0

(~A1)*B1*(~(A0*B0))

(~A1)*(~B1)*(~(A0*B0))

A1*B1

A1*B1*(~(A0*B0))

A1*B1*A0*B0

METHOD AND APPARATUS FOR VERIFYING LOGICAL EQUIVALENCY BETWEEN LOGIC CIRCUITS

BACKGROUND OF THE INVENTION

The present invention relates generally to tests of logic circuits, and more particularly to a method for analyzing a cause of a non-equivalency that has been found between two logic circuits as a result of verification of equivalency. The present invention is suitable, for example, for a layout design of an IC, such as an LSI.

As electronic apparatuses have recently required to enhance and diversify its functions, ICs, such as LSIs have also required to enhance its functionality. A logic circuit design, such as an LSI layout design, first prepares circuit data called "golden" or "specification", which has been confirmed to work and achieve given functions through simulations, and then modifies a configuration of a combinational logic circuit by inserting a testing scan circuit, a timing-adjusting buffer circuit, a timing disclosure circuit, etc. into the combinational logic circuit so as to meet various restrictions and conditions about the number of gates, delay timing, etc., without changing functions in the specification. Such data thus obtained by modifying the specification by adding essential elements for actual circuit operations to the specification is called "implementation". Here, the "combinational logic circuit" is a circuit that includes a combination of basic logic circuit elements (such as AND, OR, EXCLUSIVE OR ("EOR"), and NOT) and determines an output in accordance with one or more input(s). The input is given, for example, from a sequence circuit that holds its own state, such as a counter and a shift register latch. Then, it should be verified whether logic circuits in the specification and implementation are logically equivalent so as to maintain given functions in the specification.

One conceivable equivalency verification method would be to use the logic simulation that checks whether outputs have the same value in response to the same input pattern applied to both the specification and implementation. However, this method cannot guarantee the equivalency until it tries all the input patterns. The verification requires the total number of patterns of $2^n$ where n is the number of circuit inputs from the outside and for reality the simulation cannot try all the patterns for n of several scores.

Accordingly, a conventional method for verifying the logical equivalency between logic circuits in the specification and implementation defines part including all inputs and logic circuit elements that affect one output (referred to as "logic cone" hereinafter) for each combinational logic circuit, and verify the equivalency for each logic cone, for example, after a designer manually pairs logic circuit elements. When both are determined logically non-equivalent, a logical expression of the logic cone causing the non-equivalency is indicated and the designer manually identifies a causal logic circuit using the logical expression.

A preparation of the implementation often associates with a modification of combinational logic circuits in the specification for the reasons including a multistage configuration for small areas, priority of speed, etc. Therefore, the implementation's logic circuits differs from one that simply adds new logic circuit elements to the specification, and often modifies the specification's logic circuits, for example, by changing four stage device configuration into two stages. As a result, a corresponding logic circuit element is not easily identifiable, and the logic circuit that causes non-equivalency is often hard to be identified. In particular, the recent demands for enhanced and diversified LSI functionality have increased the number of logic circuits, and made the circuit configuration complex, whereby the logic circuit that causes non-equivalency has become increasingly hard to be identified. Therefore, the conventional verification of logic equivalency between logic circuits has been inefficient and time-consuming, delaying IC productions.

BRIEF SUMMARY OF THE INVENTION

Accordingly, it is an exemplified object of the present invention to provide an efficient method and apparatus for verifying logical equivalency between two logic circuits and easily identifying a logic circuit element that causes non-equivalency.

In order to achieve the above object, a method of one aspect of the present invention for verifying a logical equivalency between two logic circuits having different combinational logic circuits includes the steps of converting logical cones in the logic circuits into logical expressions, each logic cone including all of inputs and logic circuits which affect one output of the combinational logic circuit, storing a correlation between the logical expression converted by the converting step and one or more logic circuit elements included in the logic cone, and identifying the logic circuit element corresponding to a specified term included in the converted logical expression. This method automatically identifies the logic circuit element corresponding to the specified term (for example, operator(s) and variable(s)) in the logical expression, and thus a user promptly recognizes the logic circuit element that causes non-equivalency in the logic cone when he specifies an apparently non-equivalent term. The storing step may further store expansion history of the logical expression, so as to expand the logical expression reversibly or restorable to the original. The identifying step may be replaced with the step for identifying the logic circuit element corresponding to a non-equivalent term in the logical expression that has been converted, so as to automate checking for non-equivalency and improve the efficiency of the verification of equivalency.

A program for enabling a computer to executing the above method also constitutes one aspect of the present invention.

An apparatus of another aspect of the present invention for verifying a logical equivalency between two logic circuits having different combinational logic circuits includes the steps of a converter for converting logical cones in the logic circuits, in accordance with a dialogue with a user, into logical expressions, each logic cone including all of inputs and logic circuits which affect one output of the combinational logic circuit, a memory for storing a correlation between the logical expression converted by said converter and one or more logic circuit elements included in the logic cone, a display for indicating a structure of the logic cone and the logical expression, as well as the logic circuit element in the logic cone, which element corresponds to a specified term in the logical expression that has been converted, and an input part for specifying the term. This apparatus verifies the logical equivalency in accordance with a dialogue with a user, and indicates, on the display, the logic circuit element corresponding to the term specified by the user.

Other objects and further features of the present invention will become readily apparent from the following description of the embodiments with reference to accompanying drawings.

DETAILED DESCRIPTION OF THE INVENTION

Figure 1:
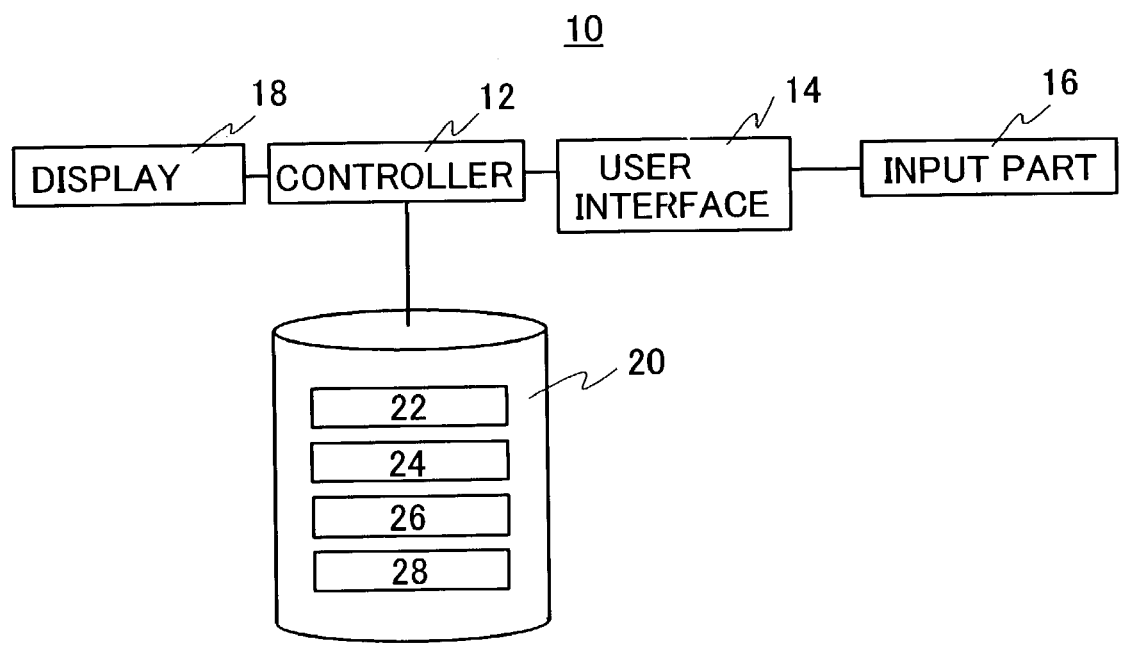
FIG. 1 is a schematic block diagram of an equivalency verification apparatus of one embodiment according to the present invention.

Referring now to FIG. 1, a description will be given of an equivalency verification apparatus 10 of one embodiment according to the present invention. Here, FIG. 1 is a schematic block diagram of a principle of the equivalency verification apparatus 10. The equivalency apparatus 10 verifies the logical equivalency between two logic circuits in a specification and implementation, and is implemented as a personal computer ("PC" hereinafter). The equivalency verification apparatus 10 includes, as shown in FIG. 1, a controller 12, a user interface 14, an input part 14, a display 18, and a memory 20.

The controller 12 controls operations of each part, as well as serving as a converter for converting a circuit into a logical expression, and an operation part for operating the logical expression. The user interface 14 sends to the controller 12 user's instructions input from the input part 16 implemented as a pointing device, such as a keyboard and mouse. The user interface 14 enables the user to dialogue with the controller 12. The user's instructions include an expansion of logical expression, a history retrieval, and a display of a circuit diagram. The display 18 is, for example, a PC display.

The memory 20 includes a specification-use logic-circuit database 22 for holding information about a structure of the logic circuit in the specification, an implementation-use logic-circuit database 24 for holding information about a structure of the logic circuit in the implementation, a first holding part 26 for holding expansion history of logical expressions, and a second holding part 28 for holding a correlation between the circuitries and the logic circuits in the specification and implementation. The first holding part holds information before and after the expansion so that the logical expression may return, while the second holding part holds correlation information between a specific term in a logical expression and a logic circuit element in a logic circuit. Although the present invention intends to cover part or all of the information in the memory 20 being provided in another terminal connected to the equivalency verification apparatus 10 through a network, the instant embodiment provides the equivalency verification apparatus 10 with the memory 20.

Figure 2:
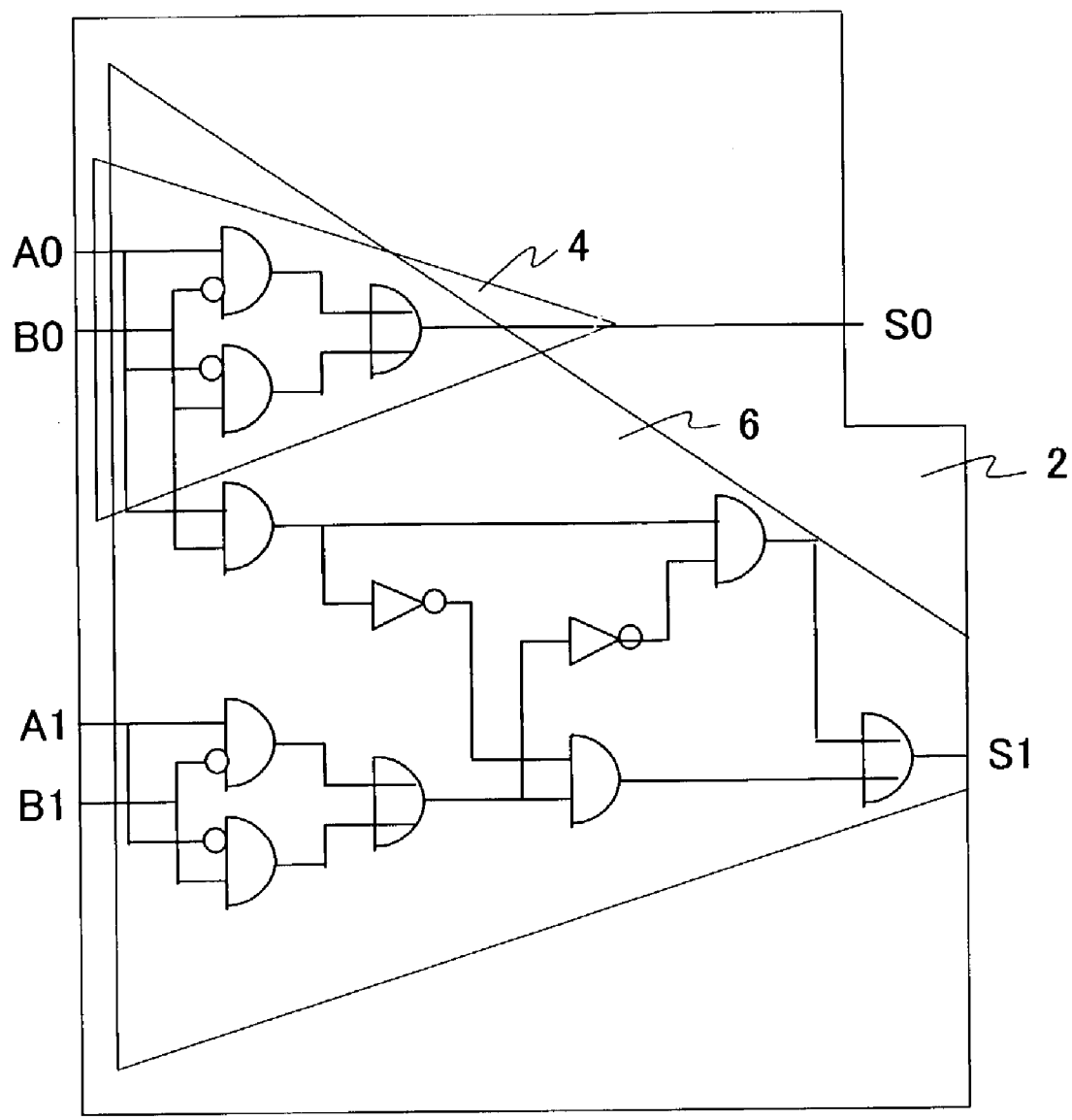
FIG. 2 is a logic circuit diagram exemplarily showing a combinational logic circuit and logic cones.

When the user commands a verification of equivalency through the input part 16 in the equivalency verification apparatus 10, the control part 12 picks up data of the specification and implementation from the databases 22 and 24 and starts verifying the equivalency. As a result of this verification of equivalency, the controller 12 picks up a non-equivalent combinational logic circuit and one or more non-equivalent logic cones in the combinational logic circuit, and displays them on the display 18. Thereby, the user may confirm the logic circuit element(s) in the logic cone on the display 18. When confirming the logic circuit element that causes non-equivalency at this time, the user may stop the equivalency verification process. The logic cone is defined as part including all of inputs and logic circuit elements that affect one output in the combinational logic circuit. FIG. 2 shows an example of a combinational logic circuit 2 having two logic cones 4 and 6.

The user may instruct to display the logical expression through the input part 16. The controller 12 converts logic cones in the specification and implementation into logical expressions. The controller 12 stores the expansion history of the logical expression in the first holding part 26 in the memory 20 so that the logical expression may be returns to the original or reversibly. This provides the history information that facilitates tracking from which term in the first logical expression a term (i.e., operator(s) and variable(s) which will be described later) in the converted logical expression results from. For example, the logic cone 4 and 6 are given as follows:

$$S0 = A0*(B0) + (A0)*B0 \qquad \text{EQUATION 1}$$

$$S1 = (A1*(B1) + (A1)*B1)*((A0*B0)) + (((A1*(B1) + (A1)*B1)))*(A0*B0) \qquad \text{EQUATION 2}$$

If necessary, the user may instruct to expand the converted logical expression through the input part 16. In response to the user's instruction, the controller 12 expands logical expressions in the specification and implementation until they become comparable with each other, e.g., down to forms of sums and products in this embodiment. The user does not send any instruction of expansion to the controller 12 if determining that two logical expressions are clearly equivalent and the expansion is unnecessary. In this way, the equivalency verification apparatus 10 converts two logical expressions in the specification and implementation into similar forms, and narrows the causal logic circuit elements that are certainly non-equivalent. If necessary, the user who wishes to see a form before the expansion sends an instruction of retrieval to the controller 12 and the controller 12 starts history retrieval in response.

The controller 12 correlates each term in a logical expression with one or more logic circuit elements in a circuit diagram, and stores information about the correlation into the second holding part 28 in the memory 20. As a result, the user when finding a non-equivalent term in the logical expression, clicks or enters the term to request the controller 12 to display the corresponding logic circuits included in the logic cone on the display 18. In response, the controller 12 displays the corresponding logic circuit element on the display 18, for example, by highlighting it with a color or thickness. This enables the user to easily identify the logic circuit element(s) that cause the non-equivalency.

Figure 3:
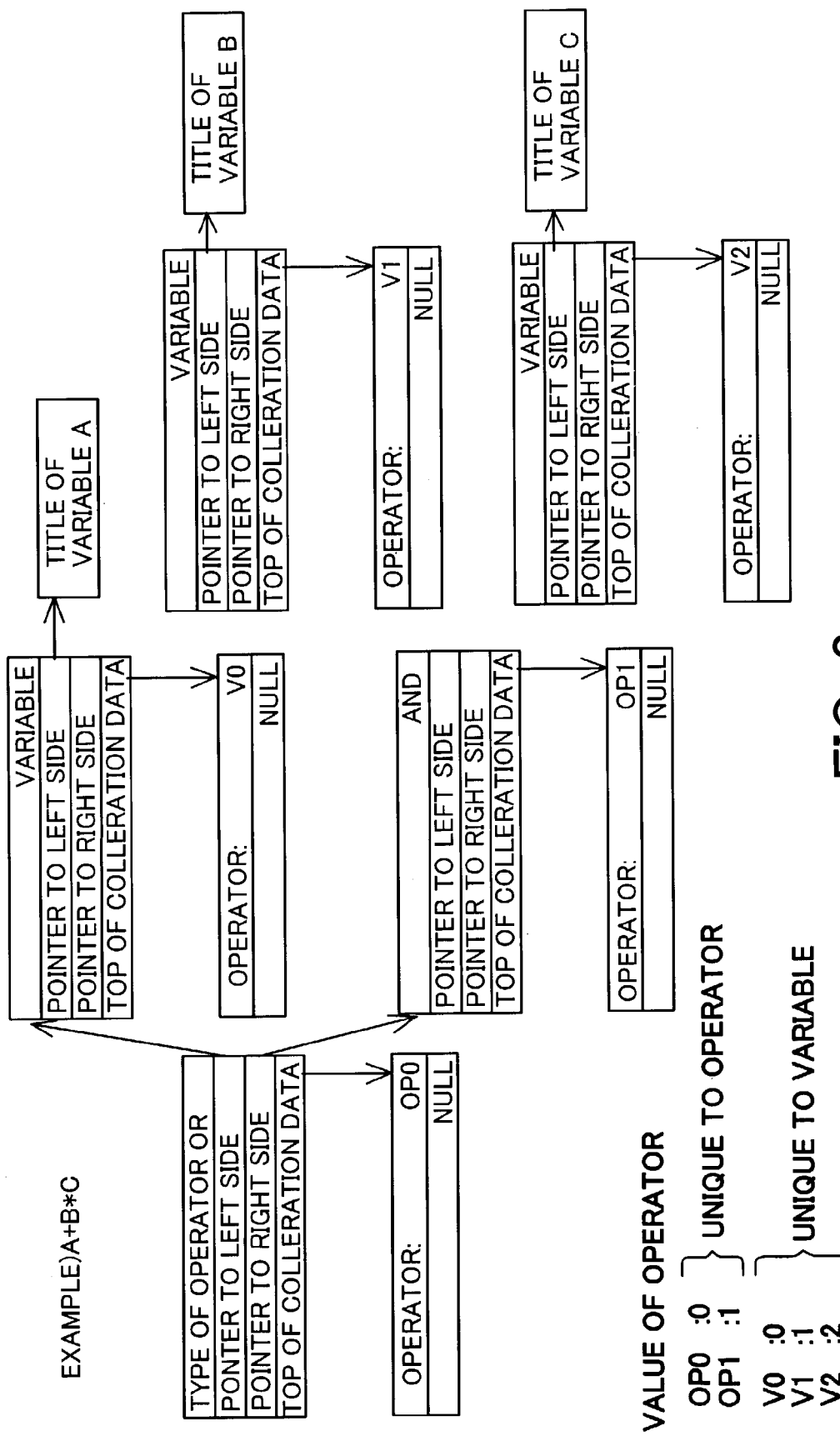
FIG. 3 is an easy example of a logical expression.

A description will now be given of the internal expression of the logical expression and correlation data stored in the second holding part 28. The logical expression includes data indicative of operator(s) and variable(s), and information about correlation data and title(s) of variable(s). The data indicative of operator(s) and variable(s) include an operator type, a pointer to a left side, a pointer to a right side, and a top of correlation data. This embodiment assigns 0 to AND, 1 to OR, 2 to NOT, 3 to EOR, 4 to NOP, and 10 to variables. The correlation data include each operator, an operator that assigned to an integer unique to a variable, and "Next" in the first logical expression. FIG. 3 shows a simple and exemplary logical expression of A+B*C. Here, each operator and a title of a variable are assigned a uniquely identifiable operator.

Figure 4:
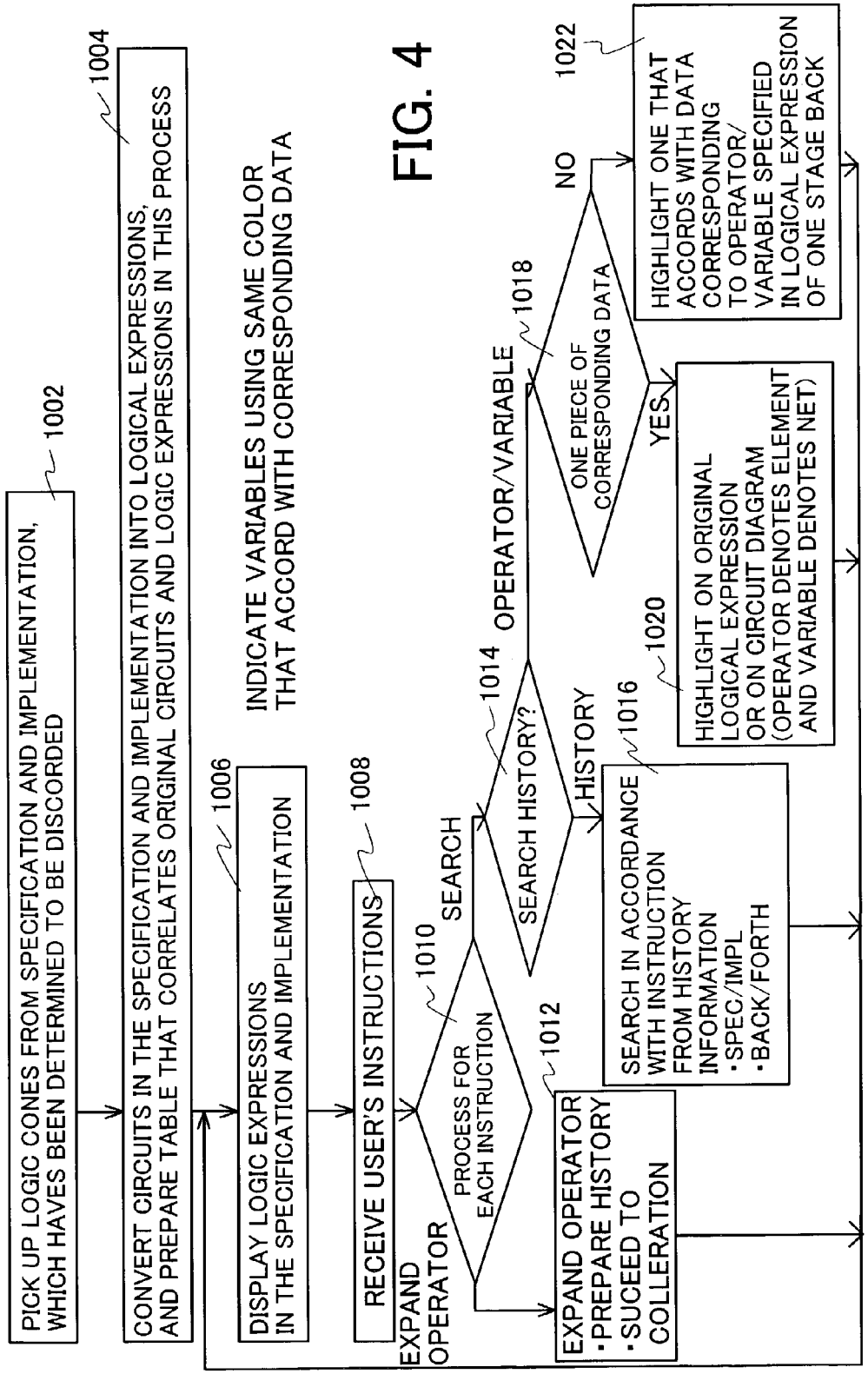
FIG. 4 is a flowchart for explaining an equivalency verification method of the instant embodiment.
Figure 5:
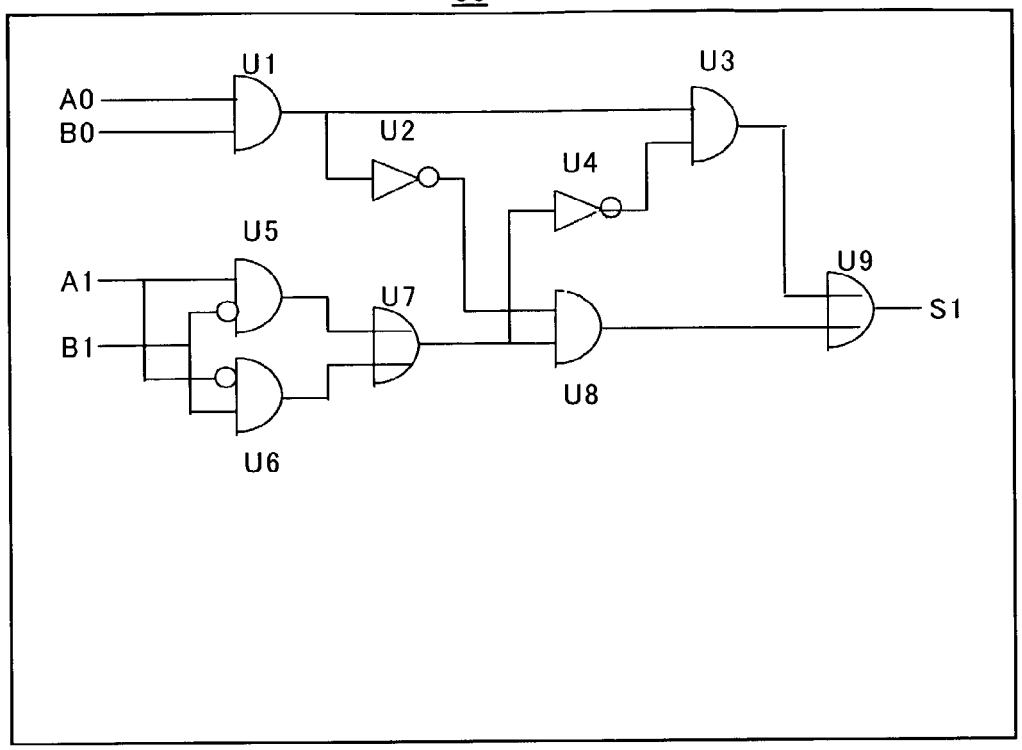
FIG. 5 is an exemplary circuit diagram of logic cones in a specification.
Figure 6:
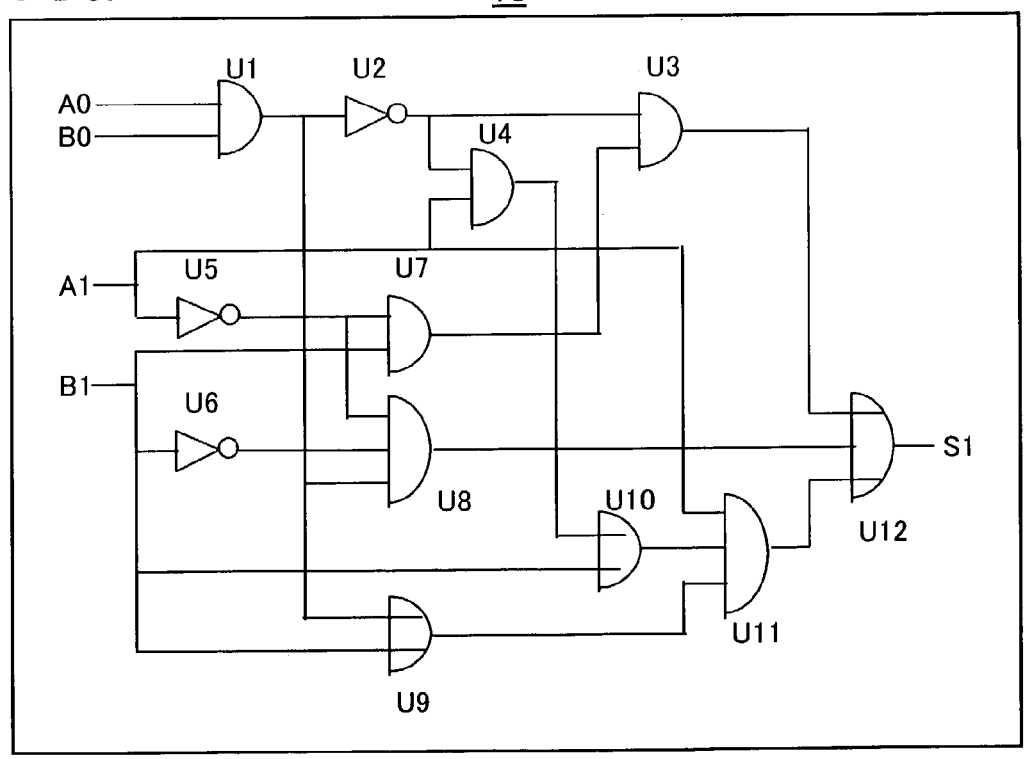
FIG. 6 is an exemplary circuit diagram of logic cones in an implementation.

Referring now to FIGS. 4–7, a description will be given of an equivalency verification method of one embodiment according to the present invention. Here, FIG. 4 is a flowchart for explaining an equivalency verification method of the instant embodiment. FIG. 5 is an exemplary circuit diagram of logic cones in a specification 60. FIG. 6 is an exemplary circuit diagram of logic cones in an implementation 70.

First, the equivalency verification device 10 obtains logic cones in the specification 60 and implementation 70 shown in FIGS. 5 and 6, which are determined to be non-equivalent (step 1002). Table 1 correlates operators OP with logic circuit elements U1–U9 and U1–U12 assigned to the specification 60 and the implementation 70, respectively.

TABLE 1

| SPECIFICATION 60 | | IMPELMENTATION 70 | |
|---|---|---|---|
| OPERATORS | LOGIC CIRCUIT ELEMENTS | OPERATORS | LOGIC CIRCUIT ELEMENTS |
| op1 | U9 | op1 | U12 |
| op2 | U8 | op2 | U12 |
| op3 | U7 | op3 | U3 |
| op4 | U5 | op4 | U7 |
| op5 | U5 | op5 | U5 |
| op6 | U6 | op6 | U2 |
| op7 | U6 | op7 | U1 |
| op8 | U2 | op8 | U8 |
| op9 | U1 | op9 | U8 |
| op10 | U3 | op10 | U5 |
| op11 | U4 | op11 | U6 |
| op12 | U7 | op12 | U1 |
| op13 | U5 | op13 | U11 |
| op14 | U5 | op14 | U11 |
| op15 | U6 | op15 | U9 |
| op16 | U6 | op16 | U1 |
| op17 | U1 | op17 | U10 |
|  |  | op18 | U2 |
|  |  | op19 | U1 |

In Table 1, the specification 60 and implementation 70 sequentially assign operators to the logic circuit elements from S1. The same logic circuit element appears: For example, U5 is an inverter and thus the operators op4 and op5 are U5 in the specification 60.

Next, the circuits in the specification 60 and 70 are converted into logical expressions (step 1004). The logical expression in the specification 60 is as indicated in Equation 3, while the logical expression in the implementation 70 is as indicated in Equation 4. This process prepares a table that correlates original circuits with logical expressions.

$$S1 = (A1*(B1)+(A1)*B1)*((A0*B0))+(\\((A1*(B1)+(A1)*B1)))*(A0*B0) \quad \text{EQUATION 3}$$

$$S1 = (A1)*B1*((A0*B0))+(A1)*(B1)*(\\(A0*B0)+(B1+(A0*B0))*(B1+((A0*B0))*A1 \quad \text{EQUATION 4}$$

Then, the logical expressions shown in Equations 3 and 4 are expanded or converted (step 1006). Equation 5 indicates the expanded or converted logical expressions in Equation 3:

$$S1 = A1*(\tilde{}B1)*(\tilde{}(A0*B0)) + \quad (1) \qquad \text{EQUATION 5}$$
$$= (\tilde{}A1)*B1*(\tilde{}(A0*B0)) + \quad (2)$$
$$= (\tilde{}A1)*(\tilde{}B1)*A0*B0 + \quad (3)$$
$$= A1*B1*A0*B0 \quad (4)$$

Equation 6 indicates the expanded or converted logical expressions in Equation 4:

$$S1 = (\tilde{}A1)*B1*(\tilde{}(A0*B0)) + \quad (a) \qquad \text{EQUATION 6}$$
$$= (\tilde{}A1)*(\tilde{}B1)*(\tilde{}(A0*B0)) + \quad (b)$$
$$= A1*B1 + \quad (c)$$
$$= A1*B1*(\tilde{}(A0*B0)) + \quad (d)$$
$$= A1*B1*A0*B0 \quad (e)$$

It is apparent that in view of Equations 5 and 6, term (2)=term (a), term (3)=term (b), term (4)=term (e), and variables having equivalent data are indicated in the same color. Therefore, it is understood that the remaining terms (1), (c) and (d) cause the non-equivalency (see Equation 7).

$$A1*(B1)*((A0*B0)) \neq A1*B1+A1*B1*A0*B0 \qquad \text{EQUATION 7}$$

FIG. 7 shows a treelike circuit diagram in the process of converting logical expressions in the specification 60. FIG. 8 is a treelike circuit diagram in the process of converting logical expressions in the implementation 70. Processes shown in FIGS. 7 and 8 follow instructions of expansion of operators (steps 1010 and 1012) after user's instructions in FIG. 4 (step 1008). In expanding logical expressions, the equivalency verification apparatus 10 prepares expansion history and succeeds to the correlation between the logical expressions and circuit diagrams. As a result, a user may retrieve back and forth the expansion history, as described later, and identify, in the circuit diagrams, the logic circuit elements corresponding to the term (i.e., operator or variable) in the logical expressions that cause non-equivalency. In other words, when there is no data correspondence between the specification 60 and implementation 70, and only one of them has data of logical expressions (step 1018), a term corresponding to the data is highlighted on the original logical expression or on the circuit diagrams shown in FIG. 7 or 8 (step 1020). If there is data correspondence (step 1018), one corresponding to data in the specified operator/variable in the logical expressions of one previous stage may be highlighted (step 1022). A user thus may narrow a non-equivalent term by checking for terms in the logical expressions with corresponding data.

Figure 7A:
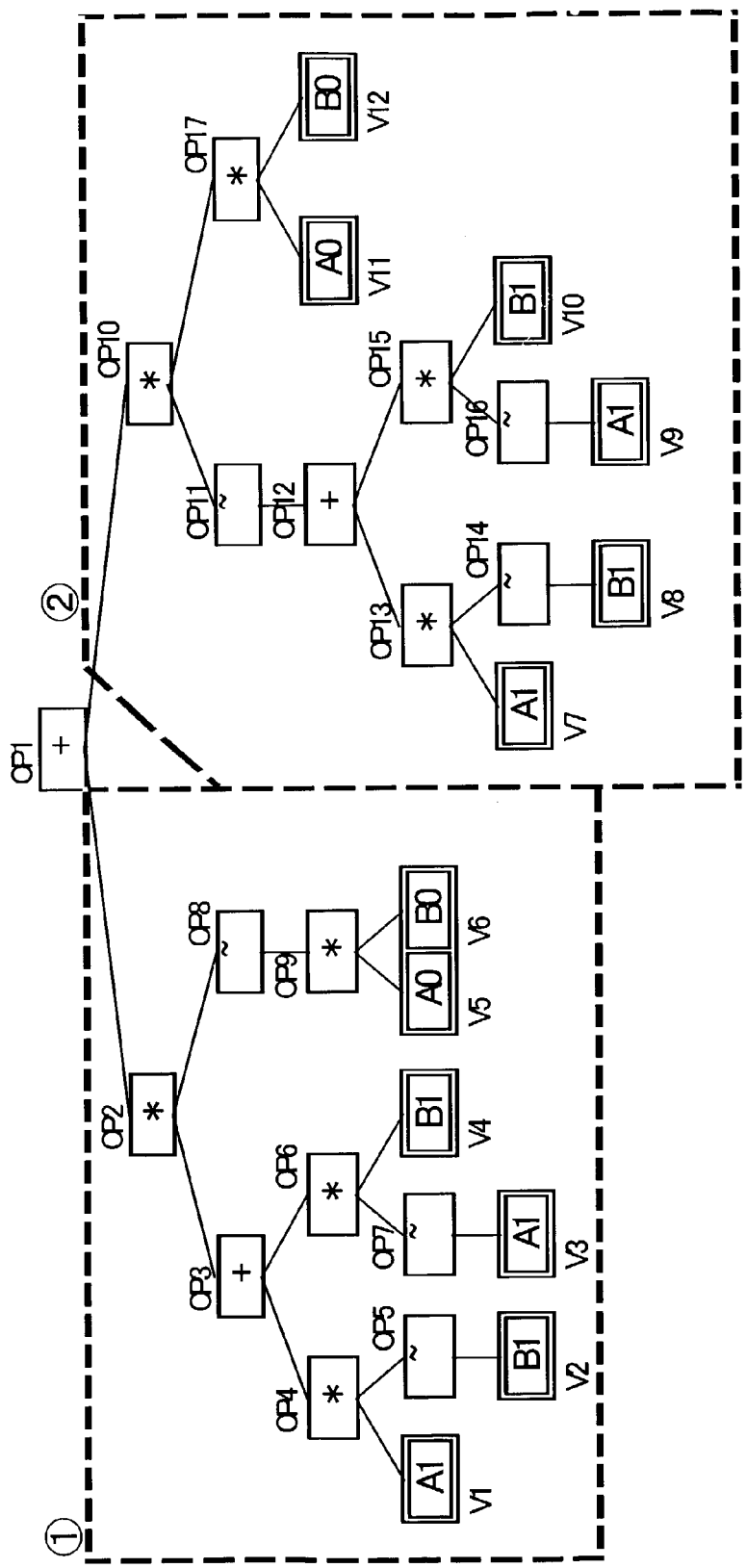
FIG. 7 is a treelike circuit diagram in a process of converting logic cones in the specification shown in FIG. 5.
Figure 7B:
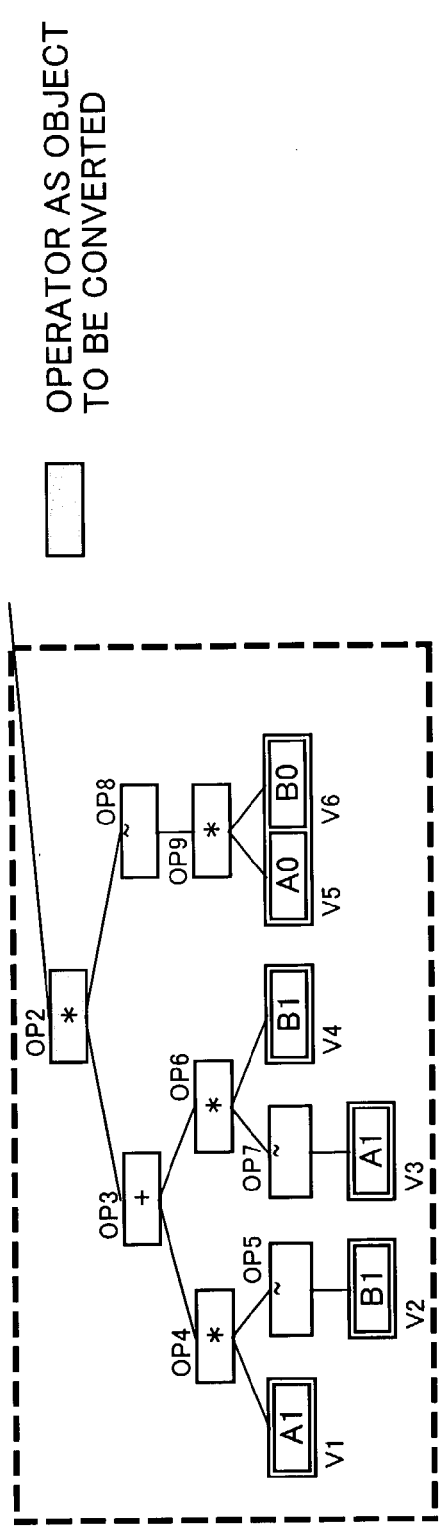
Figure 7C:
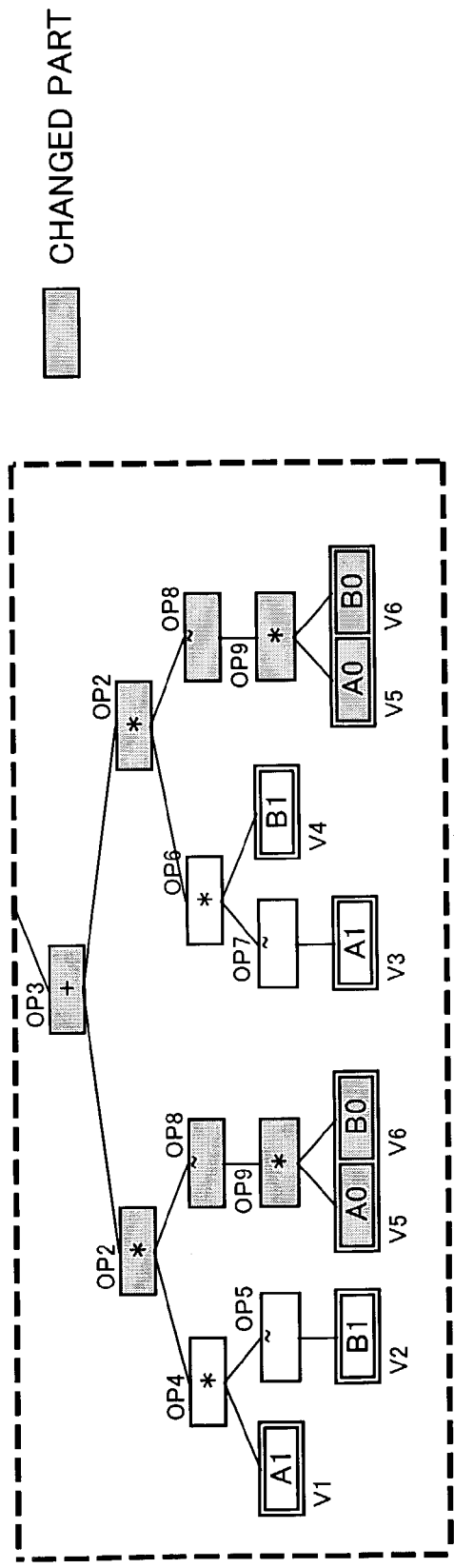

FIG. 7A is a circuit diagram in which the specification 60 is divided into op1–op17 and assigned variables V1–V12 in accordance with Table 1. FIG. 7B corresponds to part ① in FIG. 7A, and highlights op2 as an object to be converted. FIG. 7C is a circuit diagram after the circuit diagram shown in FIG. 7B is expanded with respect to op 2. Converted parts are highlighted. No corresponding data are changed in the expansion.

Figure 7D:
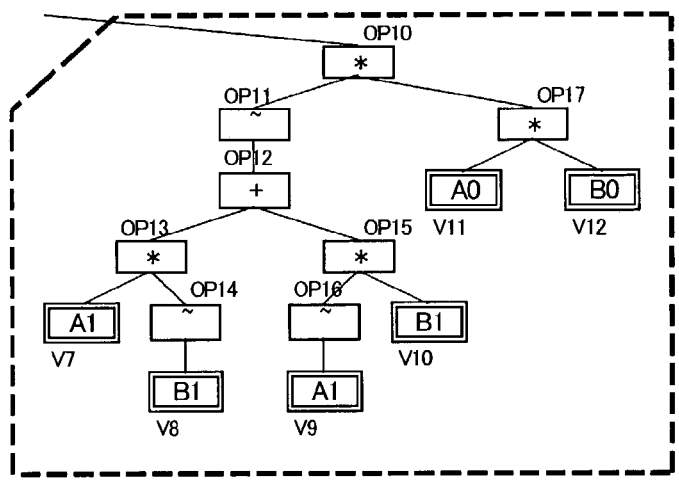
Figure 7E:
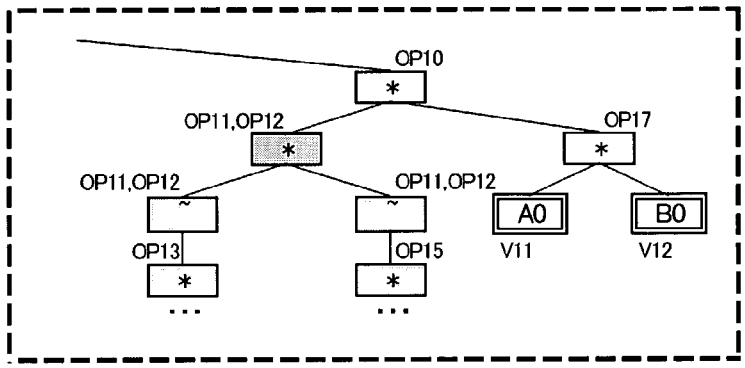

FIG. 7D corresponds to part ② in FIG. 7A, and highlights op11 and op 12 as objects to be converted. FIG. 7E is a circuit diagram after FIG. 7D is expanded with respect to op 1 and op 12 using (X+Y)=(X)+(Y). op11 and op12 prepare two ANDs and NOTs, and thus data corresponding to the generated operator store op11 and op12.

Figure 7F:
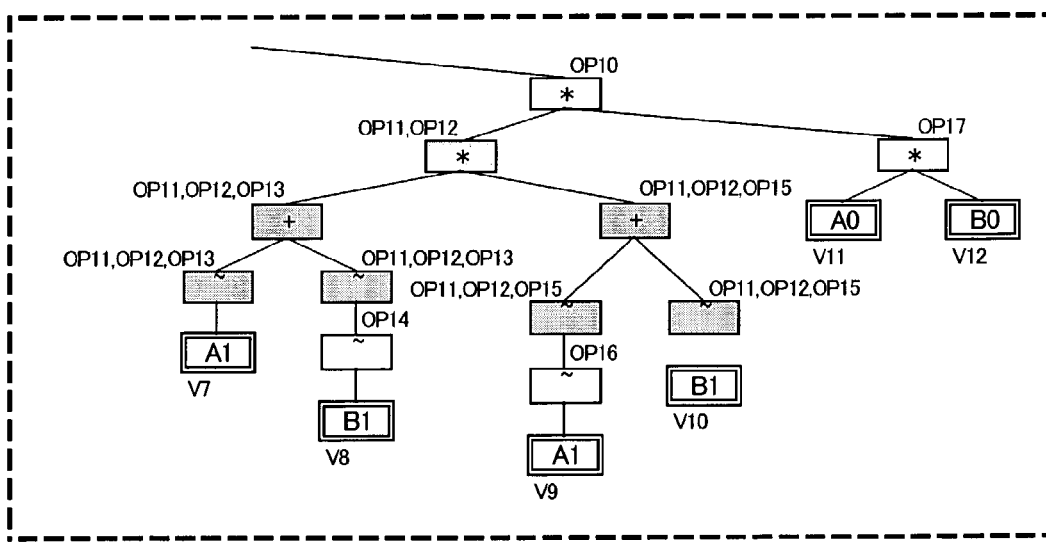

FIG. 7F is a circuit diagram after FIG. 7E is expanded with respect to op 13, a NOT operation and op 15 above it, and a NOT operation above it using (X+Y)=(X)+(Y). Op11, NOT of op12, and op13 prepare two ORs and NOTs, and thus data corresponding to the generated operator store op11 and op12. This is true to op 11, NOT of op 12, and op 15.

Figure 7I:
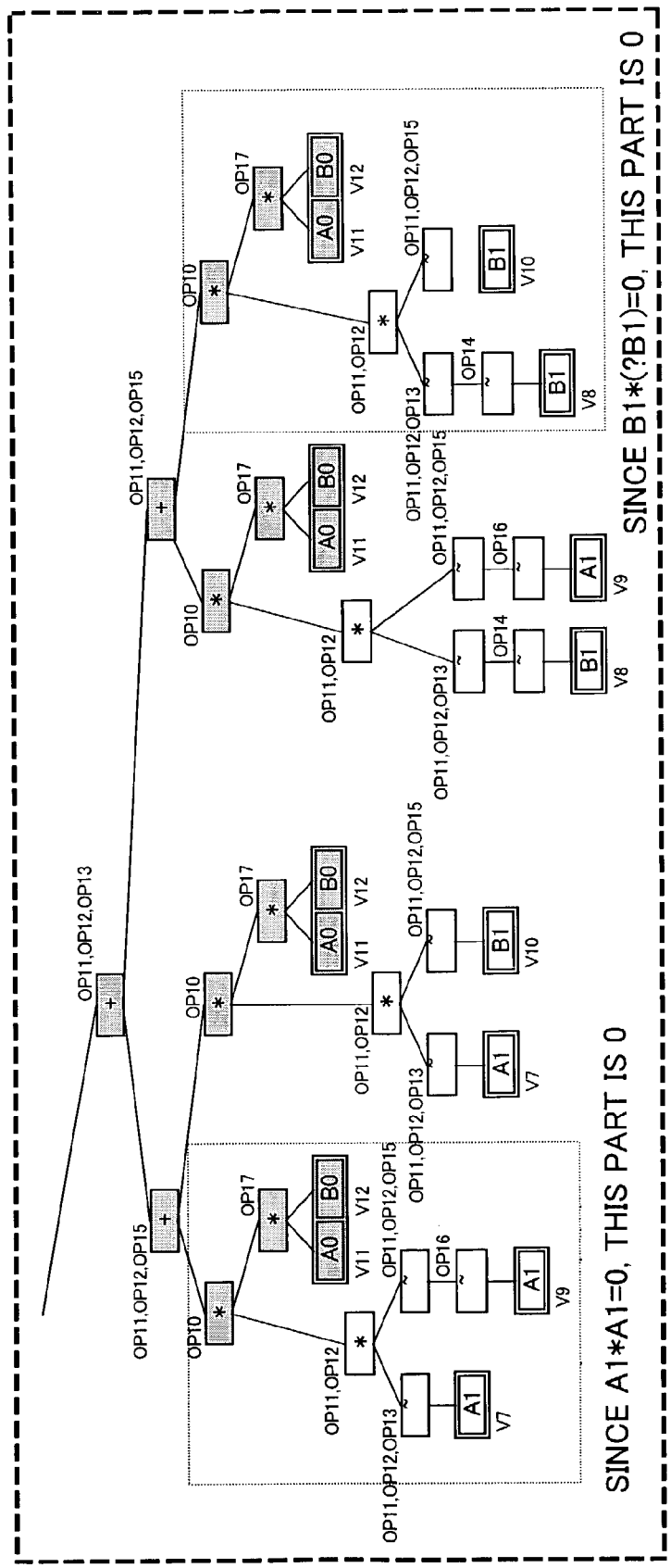
Figure 7J:
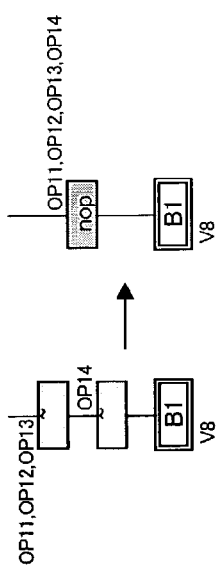
Figure 7K:
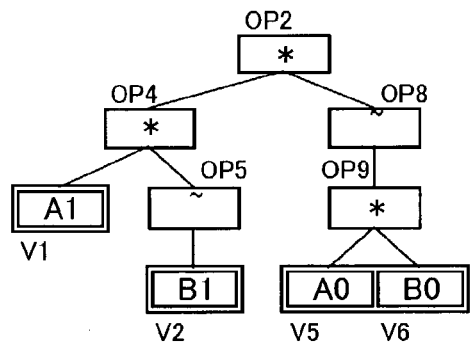
Figure 7L:
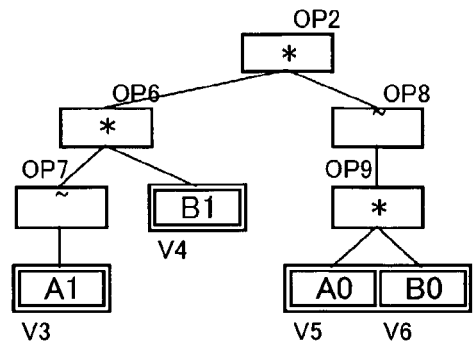
Figure 7M:
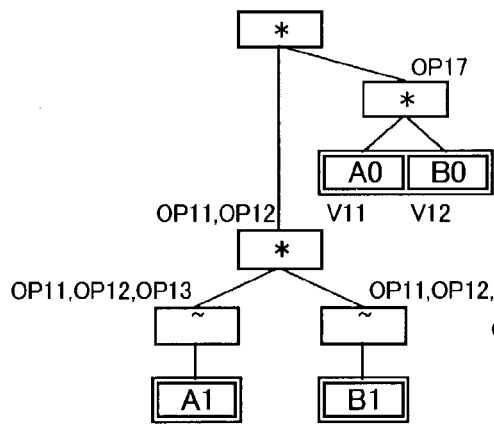
Figure 7N:
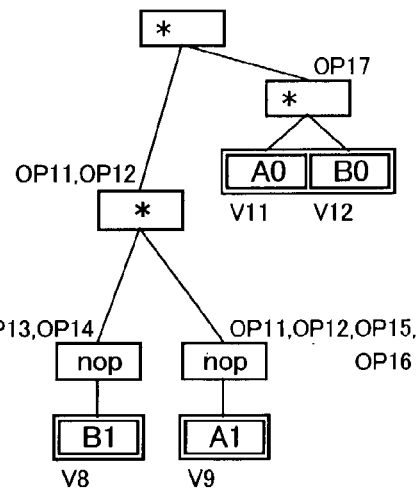

FIG. 7G is a circuit diagram after FIG. 7F is expanded with respect to AND between op 12 and op13. FIG. 7H is a circuit diagram after FIG. 7G is expanded with respect to AND between op 12 and op 13. FIG. 7I is a circuit diagram after FIG. 7H is expanded with respect to op 10. FIG. 7J is a circuit diagram showing a local optimization. FIGS. 7K to 7N are circuit diagrams corresponding to the terms (1) to (4) in Equations 5.

Figure 8A:
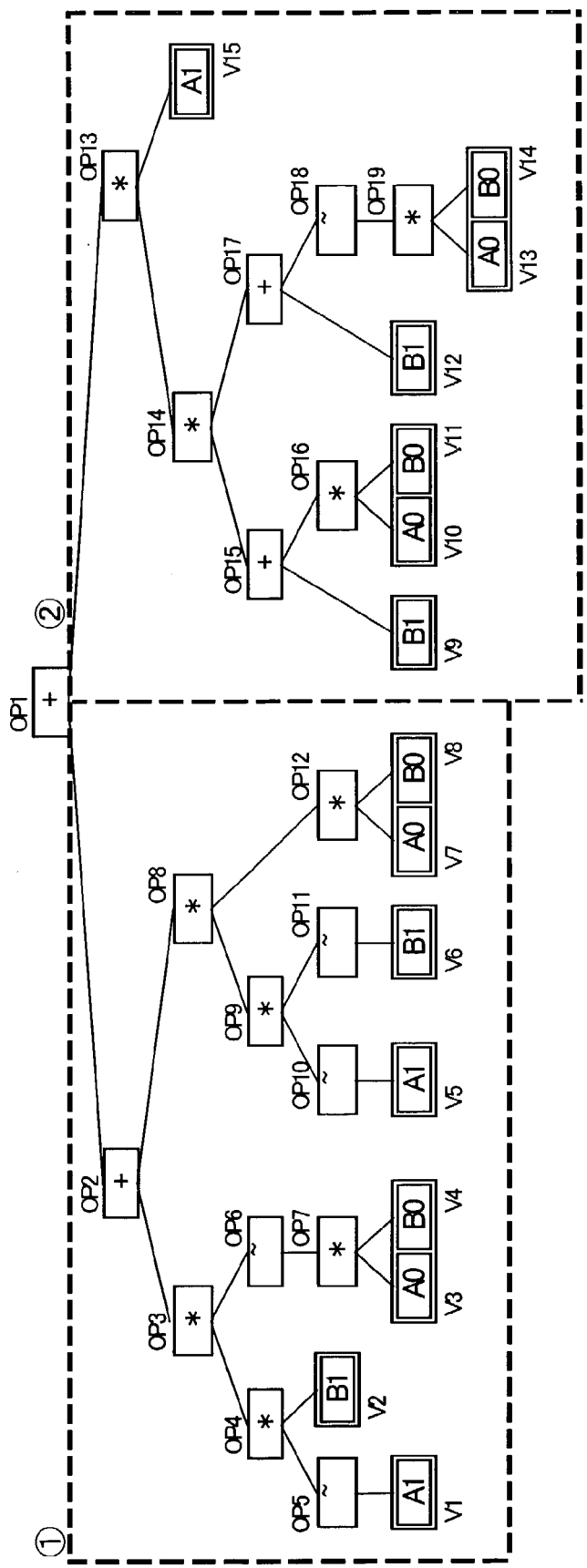
FIG. 8 is a treelike circuit diagram in a process of converting logic cones in the implementation shown in FIG. 6.
Figure 8B:
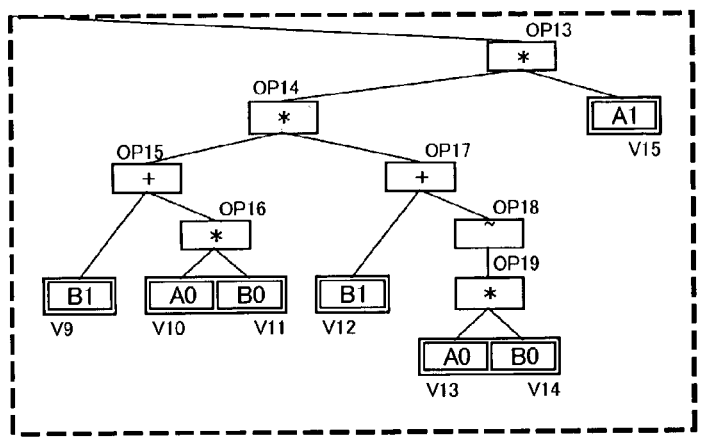
Figure 8C:
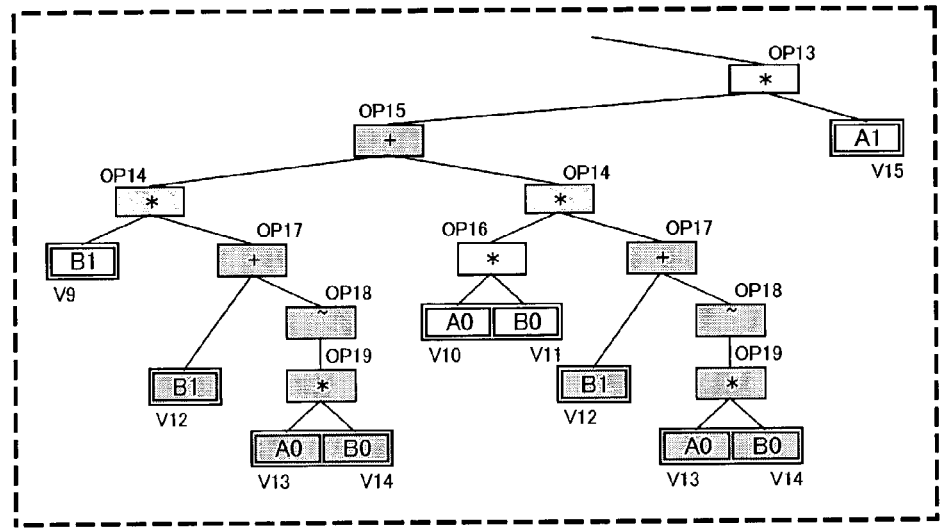
Figure 8D:
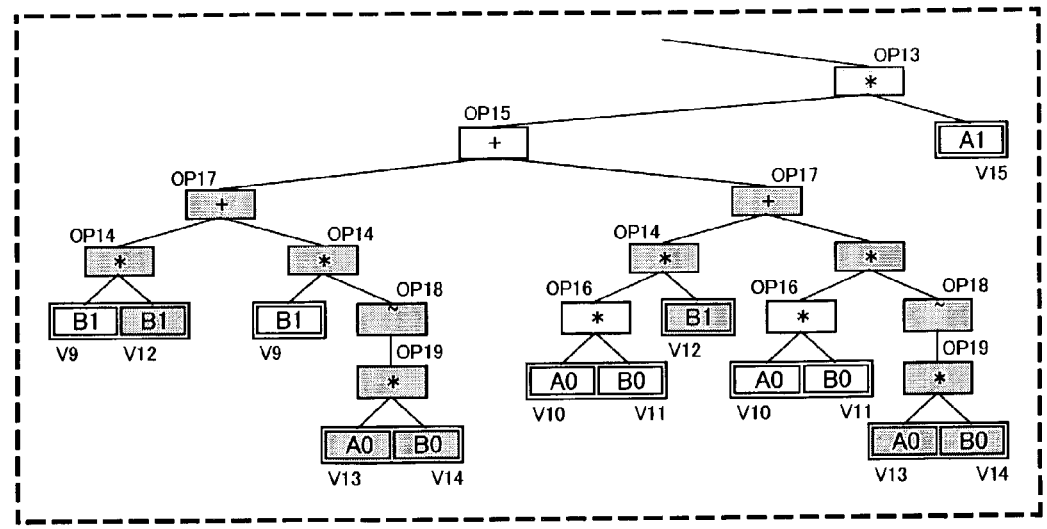
Figure 8E:
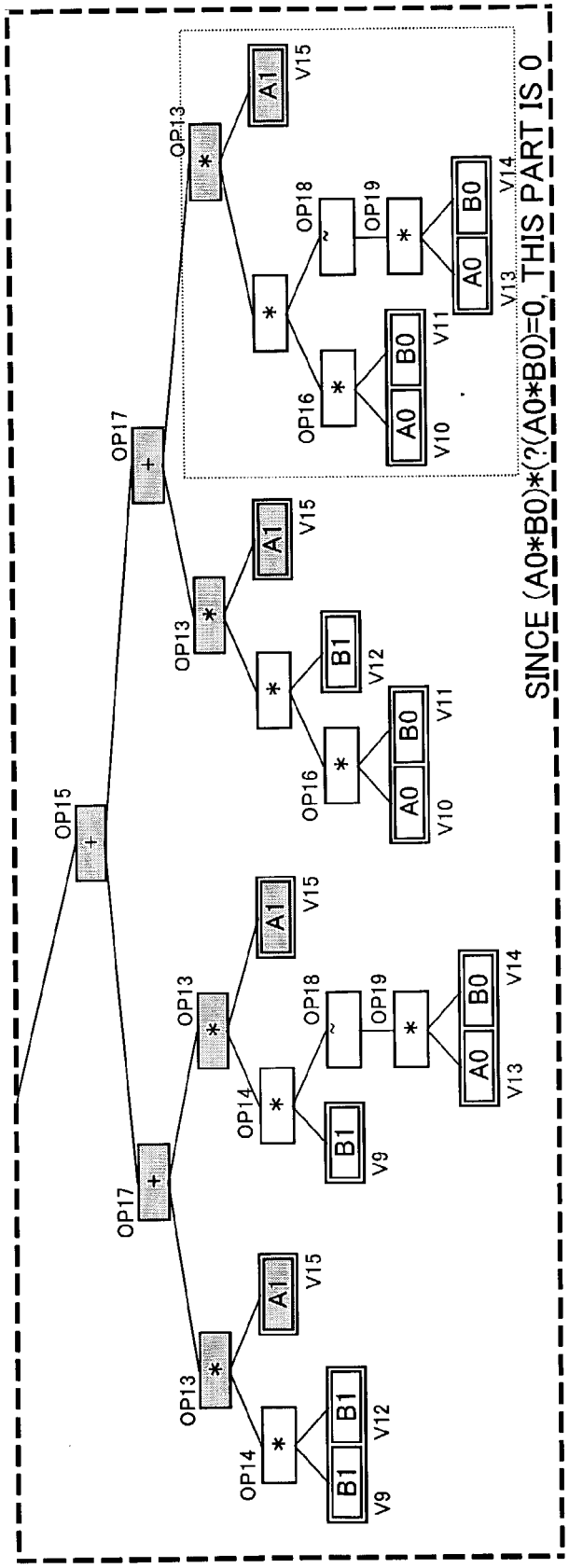
Figure 8F:
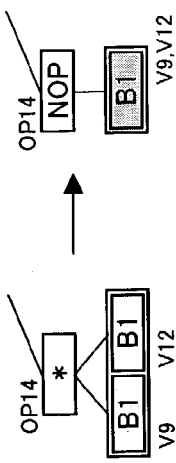
Figure 8G:
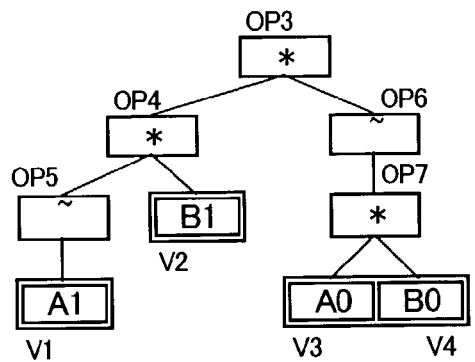
Figure 8H:
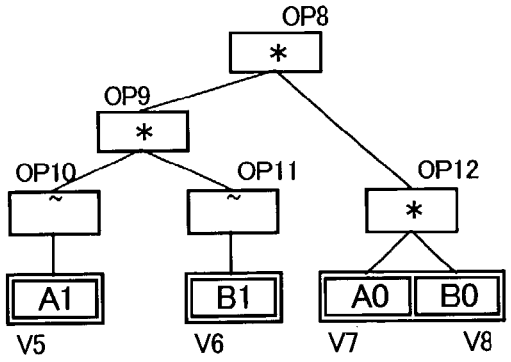
Figure 8I:
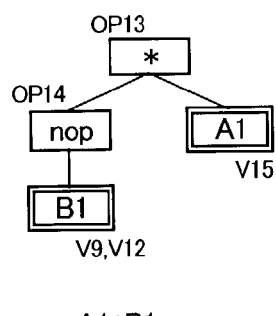
Figure 8J:
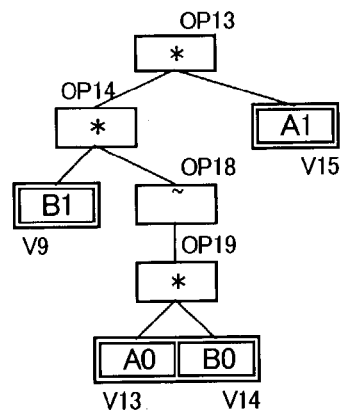
Figure 8K:
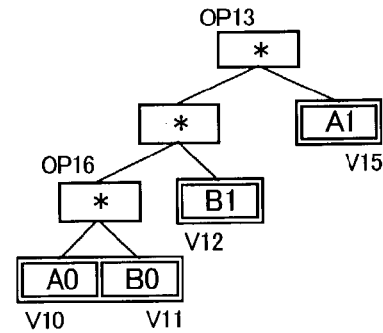

FIG. 8A is a circuit diagram in which the specification 60 is divided into op1–op19 and assigned variables V1–V15 in accordance with Table 1. FIG. 8B corresponds to part ② in FIG. 8A, and highlights op14 as an object to be converted. FIG. 8C is a circuit diagram after the circuit diagram shown in FIG. 8B is expanded with respect to op 14. FIG. 8D is a circuit diagram after the circuit diagram shown in FIG. 8C is expanded with respect to op 14. FIG. 8E is a circuit diagram after the circuit diagram shown in FIG. 8D is expanded with respect to op 13. FIG. 8F is a circuit diagram showing a local optimization. FIGS. 8G to 8K are circuit diagrams corresponding to the terms (a) to (e) in Equations 6.

When the history retrieval is commanded in FIG. 4 (step 1014) in response to user's instruction (step 1008), the user may search back and forth for logical expressions of the specification 60 and implementation 70, as described above (step 1016).

A1*B1 in the term (c) in Equation 6 is A1*B1*B1 before optimization. The last B1 is the same as B1 in A1*B1*((A0*B0)). It is easily understood from a transition view that the second B1 in Equation 7 is B1 in V9 and the first A1*B1 in the right side becomes A1*B1*(B1)=0 by substituting the second B1 in Equation 7 with (B1). In the first logical expression, it corresponds to underscored B1 in Equation 8.

$$S1=(A1)*B1*((A0*B0))+(A1)*(B1)*((A0*B0)+(\underline{B1}+(A0*B0))*(B1+((A0*B0))*A1 \quad \text{EQUATION 8}$$

Figure 9:
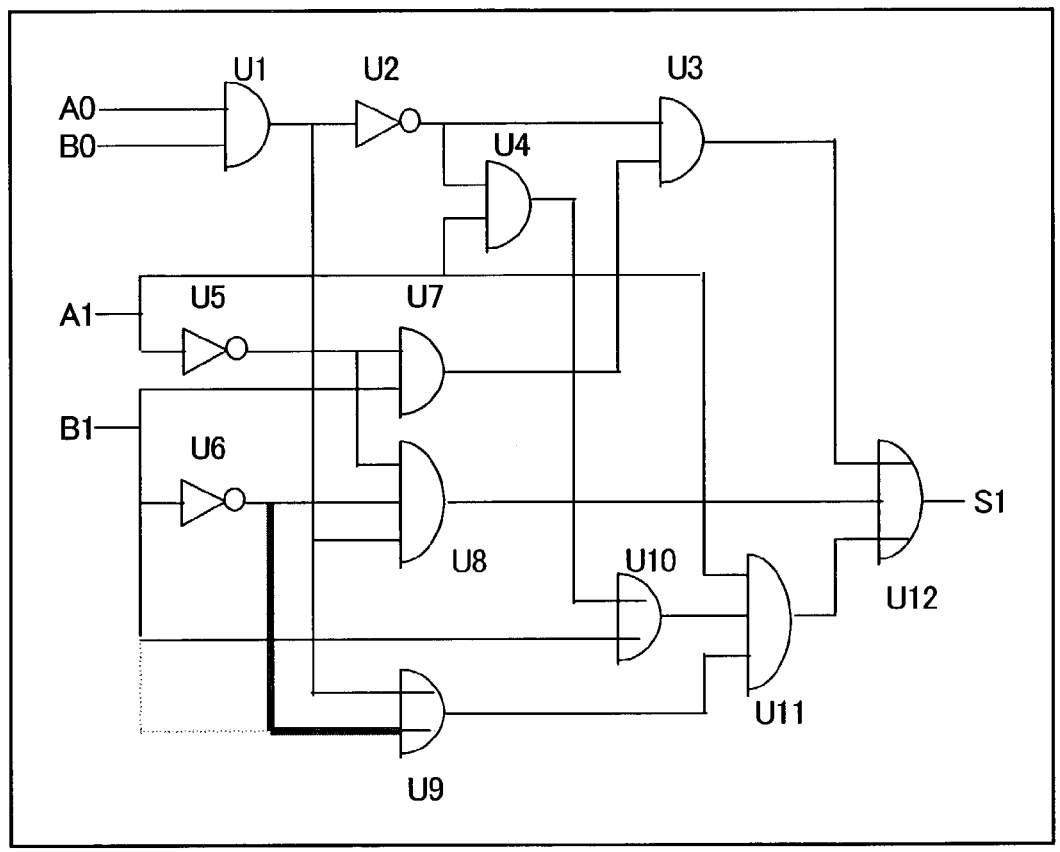
FIG. 9 is a modified circuit diagram of the implementation shown in FIG. 6 so as to correspond to the logic cones in the specification.

On the other hand, when the history retrieval is commanded in FIG. 4, U9 is obtained by searching for a relationship with neighboring operators (steps 1012 and 1014). As discussed, U9 may be highlighted in the original logical expressions or on the circuit diagram (step 1020). As a result, it is understood that the implementation 70 shown in FIG. 6 may be modified as shown in FIG. 9.

Further, the present invention is not limited to these preferred embodiments, and various modifications and variations may be made without departing from the spirit and scope of the present invention.

Thus, according to the present invention, there are provided an efficient method and apparatus for verifying logical equivalency between two logic circuits, which easily identify a causal logic circuit element for non-equivalency.

What is claimed is:

1. A method for verifying a logical equivalency between two logic circuits having different combinational logic circuit elements, said method comprising:

converting logical cones in the logic circuits into logical expressions, each logic cone including all of inputs and logic circuits which affect one output of the combinational logic circuit;

expanding the logical expressions;

storing a correlation between the logical expressions converted by said converting and expanded by said expanding and one or more logic circuit elements included in the logic cone; and identifying the logic circuit element corresponding to a specified term included in the converted logical expression.

2. A method according to claim 1, wherein said storing further stores expansion history of the logical expressions.

3. A program stored on a computer readable medium for enabling a computer to execute a method according to claim 1.

4. A method for verifying a logical equivalency between two logic circuits having different combinational logic circuit elements, said method comprising:

converting logical cones in the logic circuits into logical expressions, each logic cone including all of inputs and logic circuits which affect one output of the combinational logic circuit;

expanding the logical expressions;

storing a correlation between the logical expressions converted by said converting and expanded by said expanding and one or more logic circuit elements included in the logic cone; and identifying the logic circuit element corresponding to a non-equivalent term in the logical expression that has been converted.

5. A program stored on a computer readable medium for enabling a computer to execute a method according to claim 4.

6. An apparatus for verifying a logical equivalency between two logic circuits having different combinational logic circuit elements, said apparatus comprising:

a controller that converts logical cones in the logic circuits, in accordance with a dialogue with a user, into logical expressions, and expands the logical expressions in accordance with a dialogue with a user, each logic cone including all of inputs and logic circuits which affect one output of the combinational logic circuit;

a memory that stores a correlation between the logical expression converted by said controller and one or more logic circuit elements that are elements of logic circuits included in the logic cone;

a display that indicates a structure of the logic cone and the logical expression, as well as the logic circuit element in the logic cone, which element corresponds to a specified term in the logical expression that has been converted;

an input part that specifies the term; and a user interface that connects said input part to said controller, and transmits the term from said input Part to said controller.

7. An apparatus for verifying a logical equivalency between two logic circuits having different combinational logic circuits, said apparatus comprising:

a controller that converts logical cones in the logic circuits, in accordance with a dialogue with a user, into logical expressions, and expands the logical expressions in accordance with a dialogue with a user, each logic cone including all of inputs and logic circuits which affect one output of the combinational logic circuit;

a memory that stores a correlation between the logical expression converted by said controller and one or more logic circuit elements that are elements of logic circuits included in the logic cone;

a display that indicates a structure of the logic cone and the logical expression, as well as the logic circuit element corresponding to a non-equivalent term in the logical expression that has been converted;

an input part that specifies the term; and a user interface that connects said input part to said controller, and transmits the term from said input part to said controller.

* * * * *

UNITED STATES PATENT AND TRADEMARK OFFICE
CERTIFICATE OF CORRECTION

| | | |
|---|---|---|
| PATENT NO. | : 7,086,016 B2 | Page 1 of 1 |
| APPLICATION NO. | : 10/453662 | |
| DATED | : August 1, 2006 | |
| INVENTOR(S) | : Kazuhiro Matsuzaki et al. | |

It is certified that error appears in the above-identified patent and that said Letters Patent is hereby corrected as shown below:

Column 8, Line 54, change "Part" to --part--.

Signed and Sealed this

Twenty-sixth Day of December, 2006

JON W. DUDAS
*Director of the United States Patent and Trademark Office*